(12) United States Patent
Song et al.

(10) Patent No.: US 10,282,032 B2
(45) Date of Patent: May 7, 2019

(54) DISPLAY DEVICE

(71) Applicant: DONGWOO FINE-CHEM CO., LTD., Iksan-si, Jeollabuk-do (KR)

(72) Inventors: In Kyu Song, Pyeongtaek-si (KR); Hee Bong Kim, Pyeongtaek-si (KR); Jun Hee Sung, Incheon (KR); Min-Ho Lim, Seoul (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 15/575,353

(22) PCT Filed: Apr. 26, 2016

(86) PCT No.: PCT/KR2016/004369
§ 371 (c)(1),
(2) Date: Nov. 18, 2017

(87) PCT Pub. No.: WO2016/186332
PCT Pub. Date: Nov. 24, 2016

(65) Prior Publication Data
US 2018/0157350 A1    Jun. 7, 2018

(30) Foreign Application Priority Data
May 18, 2015    (KR) .......................... 10-2015-0068570

(51) Int. Cl.
*G06F 3/042*    (2006.01)
*G09F 9/30*    (2006.01)
*H01L 27/32*    (2006.01)
*G06F 3/044*    (2006.01)

(52) U.S. Cl.
CPC .............. *G06F 3/042* (2013.01); *G06F 3/044* (2013.01); *G09F 9/30* (2013.01); *H01L 27/323* (2013.01); *G06F 2203/04102* (2013.01)

(58) Field of Classification Search
CPC ......... G06F 2203/04102; G06F 1/1652; G06F 1/162; G06F 3/042; H01L 2251/5338; H01L 27/323
See application file for complete search history.

(56) References Cited

U.S. PATENT DOCUMENTS

2009/0051640 A1*    2/2009  Tanaka .............. G02F 1/136286
                                                              345/92
2011/0281093 A1    11/2011  Gulati et al.
(Continued)

FOREIGN PATENT DOCUMENTS

| KR | 10-2014-0145463 A | 12/2014 |
| KR | 10-2015-0043798 A | 4/2015 |
| WO | 2014027788 A1 | 2/2014 |

*Primary Examiner* — Nelson M Rosario
*Assistant Examiner* — Scott Au
(74) *Attorney, Agent, or Firm* — Maschoff Brennan

(57) ABSTRACT

A display device according to an embodiment includes a display panel, a touch module located on the display panel, a cover film located on the touch module, a first adhesive layer located between the display panel and the touch module, and a second adhesive layer located between the touch module and the cover film, wherein a thickness ratio of the first adhesive layer and the second adhesive layer with respect to a thickness of the display device is in a range of 7% to 40%.

6 Claims, 4 Drawing Sheets

(56) References Cited

U.S. PATENT DOCUMENTS

| | | | |
|---|---|---|---|
| 2014/0092322 A1* | 4/2014 | Lee | G06F 3/0416 349/12 |
| 2015/0210590 A1* | 7/2015 | Chang | C03C 21/002 428/220 |
| 2016/0237319 A1* | 8/2016 | Takarada | C09J 7/0217 |

* cited by examiner

DISPLAY DEVICE

TECHNICAL FIELD

Embodiments relate to a display device.

BACKGROUND ART

Recently, a variety of electronic devices employ a touch panel allowing an input through a touch of an image displayed on a display device by means of an input device including a finger, a stylus and the like.

Such a touch panel may be roughly classified into a resistive membrane type touch panel and a capacitive type touch panel. The resistive membrane type touch panel detects a position through a short circuit between a glass and an electrode due to a pressure of an input device. The capacitive type touch panel detects a position by sensing a variation of capacitance between electrodes when a finger touches the capacitive type touch panel.

A performance of the resistive membrane type touch panel may be degraded due to a repetitive use and scratches may occur. Therefore, interest in the capacitive type touch panel having a superior durability and a long lifespan is rising.

The capacitive type touch panel is defined as an active area at which a touch instruction input is available, and an unactive area surrounding the active area. An electrode pattern provided at the active area is formed of a transparent conductive material so as to transmit light from a display device, and a wiring pattern provided at the unactive area is formed of a conductive material.

Bended, foldable, flexible display devices have been recently developed, and a bended touch panel is required for implementing such display devices. When a touch panel is bended, there is a problem in which a defect of the touch panel is caused by generation of cracks in the electrode pattern and the wiring pattern, or in a cover film.

DISCLOSURE

Technical Problem

Therefore, an object of an embodiment is to provide a display device capable of preventing cracks.

Aspects of the present invention are not limited thereto, and additional aspects will be apparent to those of ordinary skill in the art from the following description and the appended drawings.

Technical Solution

A display device according to an embodiment includes a display panel, a touch module located on the display panel, a cover film located on the touch module, a first adhesive layer located between the display panel and the touch module, and a second adhesive layer located between the touch module and the cover film, wherein a thickness ratio of the first adhesive layer and the second adhesive layer with respect to a thickness of the display device is in a range of 7% to 40%.

Aspects of the present invention are, however, not limited thereto, and additional aspects will be apparent to those of ordinary skill in the art from the following description and the appended drawings.

Advantageous Effects

The display device according to the embodiment may prevent cracks even when having a radius of curvature to prevent a defect of the display device.

Effects of the present invention are not, however, limited thereto, and additional effects will be apparent to those of ordinary skill in the art from the following description and the appended drawings.

MODES OF THE INVENTION

Figure 1:
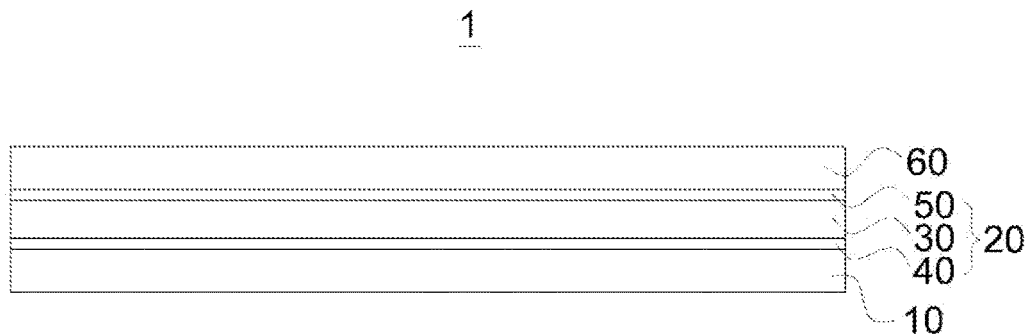
FIG. 1 is a cross-sectional view illustrating a display device according to an embodiment.

Hereinafter, a concrete embodiment of the present invention will be described in detail with reference to the accompanying drawings. However, the spirit of the present invention is not limited to the embodiments disclosed herein, and a person skilled in the art who understands the spirit of the present invention would be able to easily offer other embodiments within the scope of other retrograde invention or the present invention by adding, changing, and deleting other components within the same spirit, and it is also intended to be included in the spirit of the present invention.

Also, same components shown in the drawings of each embodiment and having same functions within a full range of the same spirit refer to the same reference numeral.

A display device according to an embodiment includes a display panel, a touch module located on the display panel, a cover film located on the touch module, a first adhesive layer located between the display panel and the touch module, and a second adhesive layer located between the touch module and the cover film. The first adhesive layer and the second adhesive layer have a thickness in a range of 7% to 40% compared to that of the display device.

The display device may have a folding stress equal to or less than 160 Mega-Pascal (Mpa).

The folding stress of the display device may be defined by Equation 1.

$$\sigma = \overline{E_f}\left[\varepsilon_{bot} + \frac{z}{h}(\varepsilon_{top} - \varepsilon_{bot})\right] \qquad \text{[Equation 1]}$$

A modulus of elasticity of the display device may be equal to or greater than 2600 Mpa.

The touch module may include a light conversion layer.

The light conversion layer may include one of a polarizing plate and a retardation film.

The display panel may be an organic light emitting display panel.

The first adhesive layer and the second adhesive layer may include an optically clear adhesive.

Hereinafter, a display device according to an embodiment will be described with reference to the accompanying drawings.

Figure 2:
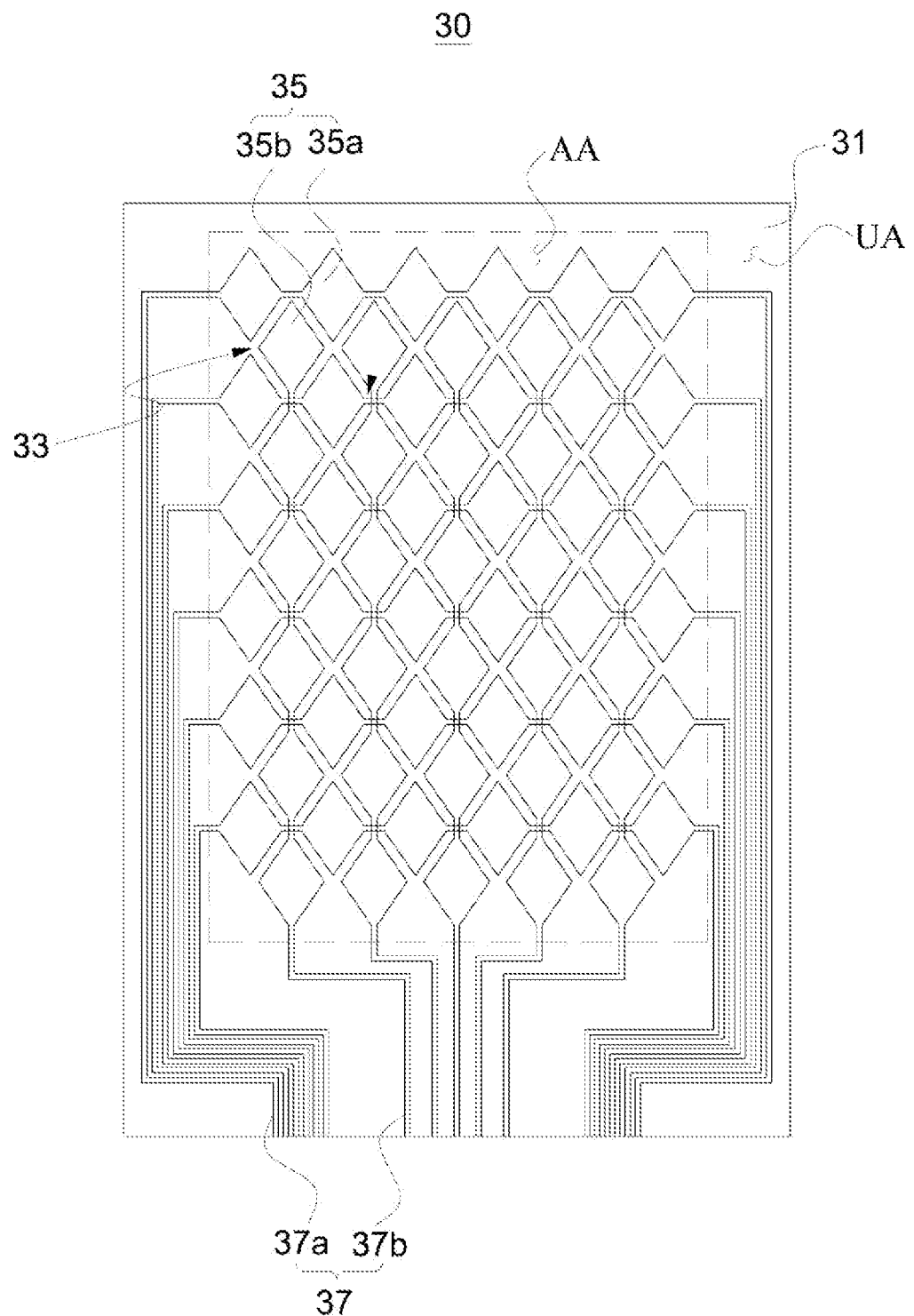
FIG. 2 is a top view illustrating a touch panel according to an embodiment.
Figure 3:
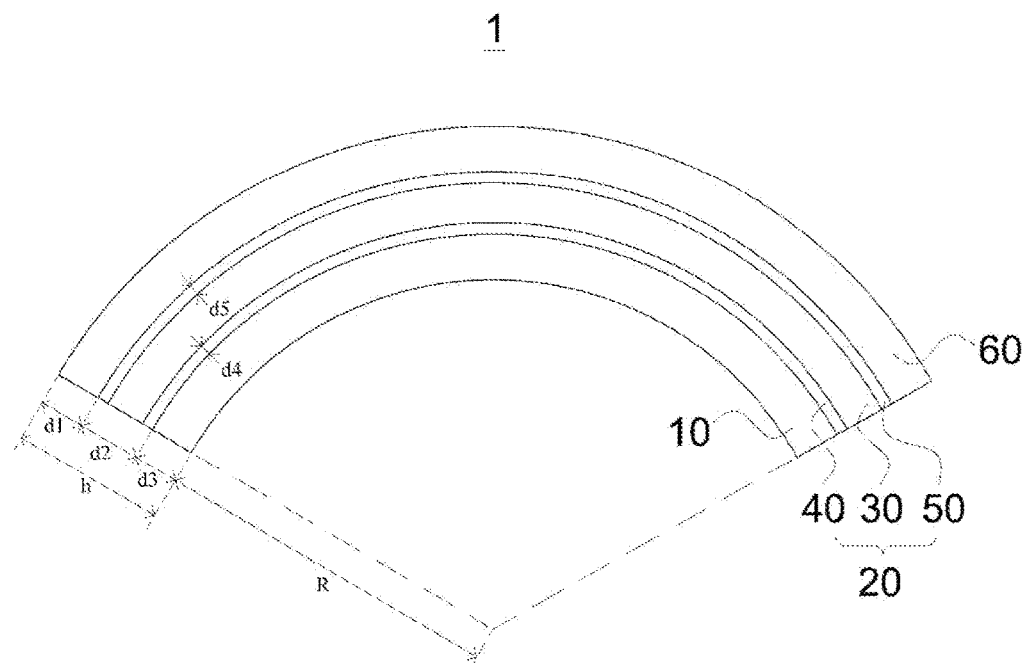
FIG. 3 is a view illustrating a bended-state display device according to an embodiment.

FIG. 1 is a cross-sectional view illustrating a display device according to an embodiment, FIG. 2 is a top view illustrating a touch panel according to an embodiment, and FIG. 3 is a view illustrating a bended-state display device according to an embodiment.

With reference to FIGS. 1 to 3, a display device 1 according to an embodiment may include a display panel 10, a touch module 20, and a cover film 60.

The display panel 10 may be a panel for displaying an image. The display panel 10 may be a liquid crystal panel or an organic light emitting panel.

The touch module 20 is located on the display panel 10. The touch module 20 may include a touch panel 30, a first adhesive layer 40, and a second adhesive layer 50.

On the display panel 10, the first adhesive layer 40, the touch panel 30, and the second adhesive layer 50 may be sequentially layered.

The first adhesive layer 40 may be located between the display panel 10 and the touch panel 30. The display panel 10 and the touch panel 30 may be attached to each other by the first adhesive layer 40. The first adhesive layer 40 may be provided in a state that an adhesive is applied to both sides thereof.

The first adhesive layer 40 may include an optically clear adhesive. The touch panel 30 may be attached by applying the first adhesive layer 40 to an entire area of the display panel 10 or to some portion thereof.

The first adhesive layer 40 may include a pressure-sensitive adhesive.

The touch panel 30 may include an active area AA and an unactive area UA. The touch panel 30 may include a substrate 31 and a pattern layer 33 formed on the substrate 31.

The active area means an area in which a touch instruction input of a user is available, whereas the unactive area UA means an area which surrounds the active area AA and is not activated in spite of a user's touch behavior not to allow the touch instruction input.

When the substrate 31 is attached to the display panel 10 to be used, the active area AA and the unactive area UA of the substrate 31 may correspond to a display area and a non-display area of the display panel 10. The display area is an area which displays an image thereon, whereas the non-display area is an area which does not display an image thereon. Therefore, the active area AA of the substrate 31 should be made of an area capable of transmitting light, whereas the unactive area UA thereof may be made of an area not transmitting light.

The pattern layer 33 may be formed on the substrate 31. The pattern layer 33 may include an electrode pattern 35 and a wiring pattern 37.

The electrode pattern 35 may be formed at the active area AA, and the wiring pattern 37 may be formed at the unactive area UA.

The electrode pattern 35 may include a first electrode pattern 35a and a second electrode pattern 35b.

A plurality of first electrode patterns 35a may be arranged in a first direction, whereas a plurality of second electrode patterns 35b may be arranged in a second direction. The second direction may be a direction intersecting with the first direction.

Each of the first electrode patterns 35a may be electrically connected thereto adjacent to each other, and each of the second electrode patterns 35b may be electrically connected thereto adjacent to each other. The first electrode pattern 35a and the second electrode pattern 35b may be defined as a unit conducting pattern, respectively. A touch pixel may be configured with at least one or more unit conducting patterns.

The electrode pattern 35 may be formed of a transparent conductive material. The electrode pattern 35 may include at least one conductive material selected from the group consisting of an indium tin oxide (ITO), an indium zinc oxide (IZO), a copper oxide, a carbon nanotube (CNT), a metal mesh, a silver nano wire, a poly(3,4-ethylenedioxythiophene) polystyrene sulfonate (PEDOT:PSS), and a nano fiber.

The wiring pattern 37 may include a first wiring pattern 37a and a second wiring pattern 37b.

The first electrode pattern 35a may be electrically connected to the first wiring pattern 37a. The first electrode pattern 35a may be integrally formed with the first wiring pattern 37a, or may be separately formed therewith.

The second electrode pattern 35b may be electrically connected to the second wiring pattern 37b. The second electrode pattern 35b may be integrally formed with the second wiring pattern 37b, or may be separately formed therewith.

The wiring pattern 37 may be formed of a transparent conducting material. When including a transparent conducting material, the wiring pattern 37 may include at least one conductive material selected from the group consisting of an ITO, a copper oxide, a CNT, a metal mesh, a silver nano wire, a PEDOT:PSS, and a nano fiber.

Alternatively, the wiring pattern 37 may include a low resistance metal material. When including a low resistance metal material, the wiring pattern 37 may include at least one selected from the group consisting of chrome (Cr), nickel (Ni), aluminum (Al), platinum (Pt), gold (Au), tungsten (W), copper (Cu), and molybdenum (Mo).

The substrate 31 may be a light conversion layer. If the substrate 31 is a light conversion layer, it may convert a polarization direction and a phase of light passing therethrough to output the converted light.

If the substrate 31 is a light conversion layer, it may include a polarizing plate and a retardation film. If the substrate 31 is a light conversion layer, it may include a polarizing plate or a retardation film.

When including a polarizing plate, the substrate 31 may convert light passing therethrough into a polarized light to output the polarized light. The polarizing plate may include a transmission axis and an absorption axis. The polarizing plate irradiated with light may transmit a polarized light in parallel with the transmission axis and absorb the remaining of the light to output the polarized light.

When including a retardation film, the substrate 31 may convert a phase of light passing therethrough to output the converted light. The retardation film may be a quarter wave plate (QWP) retarding light in phase by $\lambda/4$. When a circularly polarized light is incident into the retardation film, the retardation film may convert the circularly polarized light into a linearly polarized light. Also, when a linearly polarized light is incident into the retardation film, the retardation film may convert the linearly polarized light into a circularly polarized light.

Although not shown in the drawings, the touch module 20 may include a light conversion layer to be attached to the touch panel 30. The light conversion layer to be attached to the touch panel 30 may also include a polarizing plate and a retardation film, and the polarizing plate or the retardation film.

The second adhesive layer 50 may be layered on the touch panel 30.

The second adhesive layer 50 may be located between the touch panel 30 and the cover film 60. The touch panel 30 and the cover film 60 may be attached to each other by the second adhesive layer 50. The second adhesive layer 50 may be provided in a state that an adhesive is applied to both sides thereof.

The second adhesive layer 50 may include an optically clear adhesive. The cover film 60 may be attached by applying the second adhesive layer 50 to an entire area of the touch panel 30 or to some portion thereof.

The second adhesive layer 50 may include a pressure-sensitive adhesive.

The first adhesive layer 40 may have a fourth thickness d4, and the second adhesive layer 50 may have a fifth thickness d5.

Table 1 is experimental examples showing a modulus of elasticity, a folding stress, a generation and a non-generation of cracks according to a thickness ratio of the first adhesive layer 40 and the second adhesive layer 50 with respect to the total thickness of the display device 1.

TABLE 1

|  | Total Thickness | Sum of Thicknesses of Adhesive Layers | Thickness Ratio (%) ((d4 + d5)/h) | Modulus of Elasticity (Mpa) | Folding Stress (MPa) | Generation/ Non-generation of Cracks |
|---|---|---|---|---|---|---|
| First Experimental Example | 148 | 10 | 7 | 3744 | 112.1 | No Cracks |
| Second Experimental Example | 168 | 30 | 18 | 3298 | 124.0 | No Cracks |
| Third Experimental Example | 188 | 50 | 27 | 2947 | 135.9 | No Cracks |
| Fourth Experimental Example | 198 | 60 | 30 | 2798 | 141.9 | No Cracks |
| Fifth Experimental Example | 218 | 80 | 37 | 2542 | 153.7 | No Cracks |
| Sixth Experimental Example | 213 | 75 | 35 | 2601 | 150.8 | No Cracks |
| Seventh Experimental Example | 213 | 75 | 35 | 2601 | 150.8 | No Cracks |
| First Comparative Example | 238 | 100 | 42 | 2328 | 165.6 | Cracks |
| Second Comparative Example | 288 | 150 | 52 | 1924 | 195.4 | Cracks |
| Third Comparative Example | 338 | 200 | 59 | 1639 | 225.1 | Cracks |
| Fourth Comparative Example | 288 | 150 | 52 | 1924 | 180.5 | Cracks |

The display device 1 may be formed in a structure having a curvature. The display device 1 may be formed in a structure with a curvature to have a radius of curvature R. The radius of curvature R may mean a distance between a center of a circle having a circular arc formed of a lower surface of the display panel 10, which is a lowermost surface of the display device 1, and the lower surface of the display panel 10.

The display panel 10 may have a first thickness d1, the touch module 20 may have a second thickness d2, and the cover film 60 may have a third thickness d3. Here, the second thickness d2 of the touch module 20 may be a sum of thicknesses of the touch panel 30, the first adhesive layer 40, and the second adhesive layer 50.

The display device 1 may have a total thickness h. The total thickness h of the display device 1 may be defined as a sum of the first thickness d1, the second thickness d2, and the third thickness d3. In other words, the total thickness h of the display device 1 may be a sum of the thicknesses of the display panel 10, the touch module 20, and the cover film 60.

In the experimental examples, the total thickness h means the total thickness of the display device 1, and the sum of thicknesses of adhesive layers means a sum of the thicknesses of the first adhesive layer 40 and the second adhesive layer 50. That is, the sum of thicknesses of adhesive layers means a sum of the fourth thickness d4 and the fifth thickness d5.

The modulus of elasticity means entire moduli of elasticity of the display device 1, and the folding stress means a stress applied to the cover film 60 when the display device 1 is folded to have a radius of curvature of 3 mm. When cracks are generated in one of components of the display device 1, it is reported as "Cracks." Otherwise, if no crack is generated in any component of the display device 1, it is reported as "No Cracks."

The folding stress σ may be calculated by Equation 1 as follows.

$$\sigma = \overline{E_f}\left[\varepsilon_{bot} + \frac{z}{h}(\varepsilon_{top} - \varepsilon_{bot})\right]$$ [Equation 1]

In Equation 1, the folding stress σ applied to the cover film 60 may be in proportion to a characteristic value of the cover film 60. Here, h means the total thickness of the display device 1, and z means a distance from the lower surface of the display panel 10, which is the lowermost surface of the display device 1, to a measurement position.

Also, $\varepsilon_{top}$ means a deformation rate of an uppermost surface. That is, $\varepsilon_{top}$ means a deformation rate of an upper surface of the cover film 60, which is an uppermost surface of the display device 1.

$\varepsilon_{bot}$ means a deformation rate of a lowermost surface. That is, $\varepsilon_{bot}$ means a deformation rate of the lower surface of the display panel 10, which is the lowermost surface of the display device 1.

As described below, Equation 2 means a characteristic value of the cover film 60, Equation 3 means a characteristic value of the touch module 20, and Equation 4 means a characteristic value of the display panel 10.

$$\overline{E_f} = \frac{E_f}{1 - v_f^2} \quad \text{[Equation 2]}$$

In Equation 2, $E_f$ means a Young's modulus of the cover film 60, and $v_f$ means a Poisson's ratio thereof. The Young's modulus and the Poisson's ratio of the cover film 60 may be determined by a material thereof.

$$\overline{E_b} = \frac{E_b}{1 - v_b^2} \quad \text{[Equation 3]}$$

In Equation 3, $E_b$ means a Young's modulus of the touch module 20 and $v_b$ means a Poisson's ratio thereof. The Young's modulus and the Poisson's ratio of the touch module 20 may be determined by a material thereof.

$$\overline{E_s} = \frac{E_s}{1 - v_s^2} \quad \text{[Equation 4]}$$

In Equation 4, $E_s$ means a Young's modulus of the display panel 10 and $v_s$ means a Poisson's ratio thereof. The Young's modulus and the Poisson's ratio of the display panel 10 may be determined by a material thereof.

$$\varepsilon_{bot} = -\frac{d_1^2\overline{E_s} + d_2^2\overline{E_b} + d_3^2\overline{E_f} + 2d_1d_2\overline{E_b} + 2d_2d_3\overline{E_f} + 2d_3d_1\overline{E_f}}{2R(d_1\overline{E_s} + d_2\overline{E_b} + d_3\overline{E_f})} \quad \text{[Equation 5]}$$

$$\varepsilon_{top} = \frac{d_1^2\overline{E_s} + d_2^2\overline{E_b} + d_3^2\overline{E_f} + 2d_1d_2\overline{E_s} + 2d_2d_3\overline{E_b} + 2d_3d_1\overline{E_s}}{2R(d_1\overline{E_s} + d_2\overline{E_b} + d_3\overline{E_f})} \quad \text{[Equation 6]}$$

Equation 5 means the deformation rate $\varepsilon_{bot}$ of the lowermost surface, and Equation 6 means the deformation rate $\varepsilon_{top}$ of the uppermost surface. Here, $d_1$ means the first thickness of the display panel 10, $d_2$ means the second thickness of the touch module 20, and $d_3$ means the third thickness of the cover film 60. Also, R means the radius of curvature of the display device 1.

$$E_{all} = d_1 E_s + d_2 E_b + d_3 E_f \quad \text{[Equation 7]}$$

Equation 7 represents a total Young's moduli $E_{all}$ of the display device 1. The total Young's moduli $E_{all}$ may be defined by a sum of products of the Young's moduli and the thicknesses of the components configuring the display device 1. The Young's modulus may be regarded as a modulus of elasticity, so that all of the Young's moduli of the display device 1 may be represented by moduli of elasticity.

The first experimental example represents that the total thickness h of the display device 1 is formed to have 148 micrometer (μm) and a sum of the fourth thickness d4 of the first adhesive layer 40 and the fifth thickness d5 of the second adhesive layer 50 is formed to have 10 μm. At this point, a thickness ratio of the first adhesive layer 40 and the second adhesive layer 50 with respect to the total thickness h of the display device 1 is 7%, a modulus of elasticity is 3744 Mpa, and a folding stress is 112.1 Mpa. In this case, no crack is generated in overall components of the display device 1.

The second experimental example represents that the total thickness h of the display device 1 is formed to have 168 μm and a sum of the fourth thickness d4 of the first adhesive layer 40 and the fifth thickness d5 of the second adhesive layer 50 is formed to have 30 μm. At this point, a thickness ratio of the first adhesive layer 40 and the second adhesive layer 50 with respect to the total thickness h of the display device 1 is 18%, a modulus of elasticity is 3298 Mpa, and a folding stress is 124.0 Mpa. In this case, no crack is generated in the overall components of the display device 1.

The third experimental example represents that the total thickness h of the display device 1 is formed to have 188 μm, and a sum of the fourth thickness d4 of the first adhesive layer 40 and the fifth thickness d5 of the second adhesive layer 50 is formed to have 50 μm. At this point, a thickness ratio of the first adhesive layer 40 and the second adhesive layer 50 with respect to the total thickness h of the display device 1 is 27%, a modulus of elasticity is 2947 Mpa, and a folding stress is 135.9 Mpa. In this case, no crack is generated in the overall components of the display device 1.

The fourth experimental example represents that the total thickness h of the display device 1 is formed to have 198 μm, and a sum of the fourth thickness d4 of the first adhesive layer 40 and the fifth thickness d5 of the second adhesive layer 50 is formed to have 60 μm. At this point, a thickness ratio of the first adhesive layer 40 and the second adhesive layer 50 with respect to the total thickness h of the display device 1 is 30%, a modulus of elasticity is 2798 Mpa, and a folding stress is 141.9 Mpa. In this case, no crack is generated in the overall components of the display device 1.

The fifth experimental example represents that the total thickness h of the display device 1 is formed to have 218 μm, and a sum of the fourth thickness d4 of the first adhesive layer 40 and the fifth thickness d5 of the second adhesive layer 50 is formed to have 80 μm. At this point, a thickness ratio of the first adhesive layer 40 and the second adhesive layer 50 with respect to the total thickness h of the display device 1 is 37%, a modulus of elasticity is 2542 Mpa, and a folding stress is 153.7 Mpa. In this case, no crack is generated in the overall components of the display device 1.

The sixth experimental example represents that the total thickness h of the display device 1 is formed to have 213 μm, and a sum of the fourth thickness d4 of the first adhesive layer 40 and the fifth thickness d5 of the second adhesive layer 50 is formed to have 75 μm. At this point, a thickness ratio of the first adhesive layer 40 and the second adhesive layer 50 with respect to the total thickness h of the display device 1 is 35%, a modulus of elasticity is 2601 Mpa, and a folding stress is 150.8 Mpa. In this case, no crack is generated in the overall components of the display device 1.

The seventh experimental example represents that the total thickness h of the display device 1 is formed to have 213 μm and a sum of the fourth thickness d4 of the first adhesive layer 40 and the fifth thickness d5 of the second adhesive layer 50 is formed to have 75 μm. At this point, a thickness ratio of the first adhesive layer 40 and the second adhesive layer 50 with respect to the total thickness h of the display device 1 is 35%, a modulus of elasticity is 2601 Mpa, and a folding stress is 150.8 Mpa. In this case, no crack is generated in the overall components of the display device 1.

Although the sums of the thicknesses of the adhesive layers of the sixth experimental example and the seventh experimental example are the same as each other, the thickness of the first adhesive layer 40 was formed to have 25 μm and the thickness of the second adhesive layer 50 was formed to have 50 μm, in the sixth experimental example. On the other hand, in the seventh experimental example, the thickness of the first adhesive layer 40 was formed to have 50 μm and the thickness of the second adhesive layer 50 was formed to have 25 μm. Through the sixth experimental example and the seventh experimental example, it can be seen that a same modulus of elasticity and a same folding stress may be obtained when a sum of the thicknesses of the adhesive layers 40 and 50 is constant even though thicknesses of the first adhesive layer 40 and the second adhesive layer 50 are different from each other.

The first to fourth comparative examples represent a sum of the thicknesses of the adhesive layers 40 and 50 and a thickness ratio thereof with respect to the total thickness when cracks are generated.

The first comparative example represents that the total thickness h of the display device 1 is formed to have 238 μm, and a sum of the fourth thickness d4 of the first adhesive layer 40 and the fifth thickness d5 of the second adhesive layer 50 is formed to have 100 μm. At this point, a thickness ratio of the first adhesive layer 40 and the second adhesive layer 50 with respect to the total thickness h of the display device 1 is 42%, a modulus of elasticity is 2328 Mpa, and a folding stress is 165.6 Mpa. In this case, cracks are generated in any one of the components of the display device 1.

The second comparative example represents that the total thickness h of the display device 1 is formed to have 288 μm, and a sum of the fourth thickness d4 of the first adhesive layer 40 and the fifth thickness d5 of the second adhesive layer 50 is formed to have 150 μm. At this point, a thickness ratio of the first adhesive layer 40 and the second adhesive layer 50 with respect to the total thickness h of the display device 1 is 52%, a modulus of elasticity is 1924 Mpa, and a folding stress is 195.4 Mpa. In this case, cracks are generated in any one of the components of the display device 1.

The third comparative example represents that the total thickness h of the display device 1 is formed to have 338 μm, and a sum of the fourth thickness d4 of the first adhesive layer 40 and the fifth thickness d5 of the second adhesive layer 50 is formed to have 200 μm. At this point, a thickness ratio of the first adhesive layer 40 and the second adhesive layer 50 with respect to the total thickness h of the display device 1 is 59%, a modulus of elasticity is 1639 Mpa, and a folding stress is 225.1 Mpa. In this case, cracks are generated in any one of the components of the display device 1.

The fourth comparative example represents that the total thickness h of the display device 1 is formed to have 288 μm, and a sum of the fourth thickness d4 of the first adhesive layer 40 and the fifth thickness d5 of the second adhesive layer 50 is formed to have 150 μm. At this point, a thickness ratio of the first adhesive layer 40 and the second adhesive layer 50 with respect to the total thickness h of the display device 1 is 52%, a modulus of elasticity is 1924 Mpa, and a folding stress is 180.5 Mpa. In this case, cracks are generated in any one of the components of the display device 1.

When the thickness ratio of the first adhesive layer 40 and the second adhesive layer 50 with respect to the total thickness of the display device 1 is in the range of 7% to 40%, no crack is generated and assembly stability may be improved. When the thickness ratio of the first adhesive layer 40 and the second adhesive layer 50 with respect to the total thickness of the display device 1 is less than 7%, adhesive strengths of the first adhesive layer 40 and the second adhesive layer 50 which attach the display device 1, the touch module 20, and the cover film 60 may not be assured so that assembly stability may not be secured. Also, when the thickness ratio of the first adhesive layer 40 and the second adhesive layer 50 with respect to the total thickness of the display device 1 is greater than 40%, cracks are generated in the components of the display device 1 as in the comparative examples so that a defect may occur.

Figure 4:
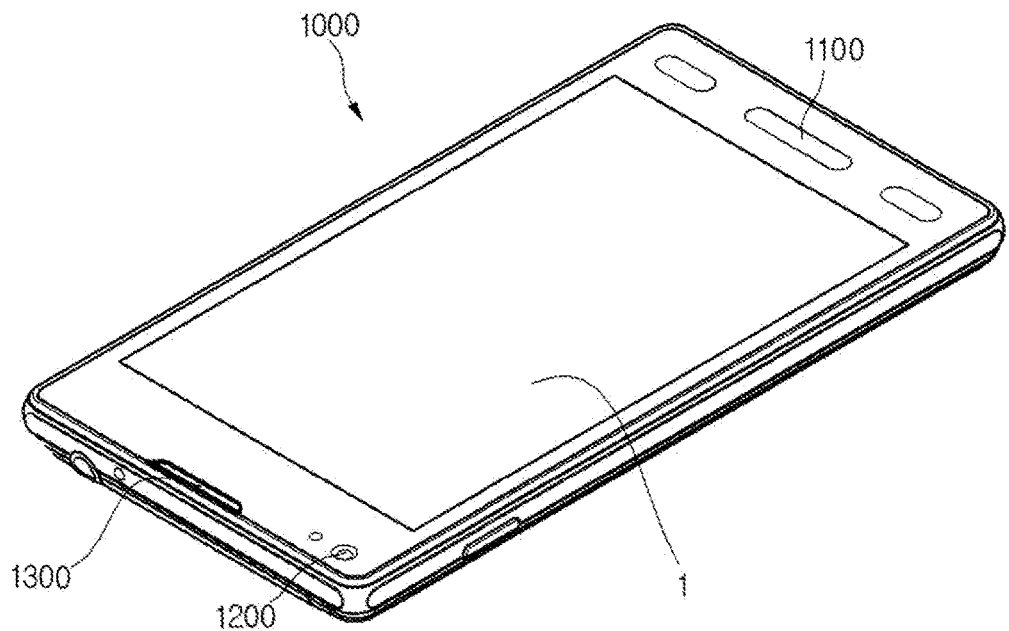
FIG. 4 is a perspective view of a device employing the display device according to the embodiment.

FIG. 4 is a perspective view of a device employing the touch module and the display device according to the embodiment.

With reference to FIG. 4, an input button 1100 for inputting an instruction from an external side, a camera 1200 for taking a still image and a moving image, and a speaker 1300 for outputting voice may be formed at a device 1000.

The device 1000 may include the display device 1 described above.

The display device 1 may be applicable to a variety of products including a mobile phone, a television (TV), a navigation device and the like.

A display device has been described as an example of a device to which the touch module according to the embodiments of the present invention is applicable, but it is not limited thereto, and the touch module according to the embodiments of the present invention may be applicable to a variety of products including a keypad, a touch pad for a notebook, a touch input device for a vehicle, and the like.

Although configurations and features of the present invention have been described in conjunction with embodiments of the present invention, the present invention is not limited thereto, and it should be understood that numerous other modifications and changes can be devised by those skilled in the art that will fall within the spirit and scope of the principles of this disclosure. Therefore, the scope of the present invention should be construed by the appended claims, along with the full range of modifications and changes and to which such claims are entitled.

INDUSTRIAL APPLICABILITY

Embodiments can be used in the field of display devices.

The invention claimed is:
1. A display device comprising:
a display panel;
a touch module located on the display panel;
a cover film located on the touch module;
a first adhesive layer located between the display panel and the touch module; and a second adhesive layer located between the touch module and the cover film, wherein a thickness ratio of the first adhesive layer and the second adhesive layer with respect to a thickness of the display device is in a range of 7% to 40%, wherein a folding stress of the display device is equal to or less than 160 Mega-Pascal (Mpa), and wherein the folding stress of the display device is defined by Equation 1 as follows:

$$\sigma = \overline{E_f}\left[\varepsilon_{bot} + \frac{z}{h}(\varepsilon_{top} - \varepsilon_{bot})\right].$$ [Equation 1]

2. The display device of claim 1, wherein a modulus of elasticity of the display device is equal to or greater than 2600 Mpa.

3. The display device of claim 1, wherein the touch module includes a light conversion layer.

4. The display device of claim 3, wherein the light conversion layer includes one of a polarizing plate and a retardation film.

5. The display device of claim 1, wherein the display panel is an organic light emitting display panel.

6. The display device of claim 1, wherein the first adhesive layer and the second adhesive layer include an optically clear adhesive.

* * * * *